(12) United States Patent
Lin et al.

(10) Patent No.: US 10,250,188 B2
(45) Date of Patent: Apr. 2, 2019

(54) VOLTAGE CONTROLLED OSCILLATOR

(71) Applicant: National Chi Nan University, Nantou County (TW)

(72) Inventors: Yo-Sheng Lin, Taichung (TW); Kai-Siang Lan, Kaohsiung (TW); Jin-You Liao, Nantou County (TW)

(73) Assignee: NATIONAL CHI NAN UNIVERSITY, Puli Township, Nantou County (TW)

( * ) Notice: Subject to any disclaimer, the term of this patent is extended or adjusted under 35 U.S.C. 154(b) by 127 days.

(21) Appl. No.: 15/635,724

(22) Filed: Jun. 28, 2017

(65) Prior Publication Data

US 2018/0309407 A1  Oct. 25, 2018

(30) Foreign Application Priority Data

Apr. 20, 2017 (TW) .............................. 106113287 A (51) Int. Cl.
*H03B 5/08* (2006.01)
*H03B 5/18* (2006.01)
*H03B 5/12* (2006.01)

(52) U.S. Cl.
CPC ..... *H03B 5/1212* (2013.01); *H03B 2200/004* (2013.01); *H03B 2200/0038* (2013.01)

(58) Field of Classification Search
CPC ............ H03B 5/1212; H03B 2200/004; H03B 2200/0038
USPC ................................ 331/117 R, 117 FE, 167
See application file for complete search history.

(56) References Cited

FOREIGN PATENT DOCUMENTS

TW          M407549 U       7/2011

*Primary Examiner* — Richard Tan
(74) *Attorney, Agent, or Firm* — Muncy, Geissler, Olds & Lowe, P.C.

(57) ABSTRACT

A voltage controlled oscillator includes a resonance unit, coupling unit and source degeneration unit. The resonance unit includes two first inductors and two first variable capacitors. The first inductor is electrically connected to the first variable capacitor. The coupling unit includes a first transistor and a second transistor. Power supply input terminals of the first and second transistors are electrically connected to the resonance unit. The source degeneration unit includes two adjustable inductors, two fourth inductors and two second variable capacitors. The adjustable inductors are connected to power supply output terminals of the first and second transistors, respectively. The second variable capacitor is electrically connected to the adjustable inductor and the fourth inductor, wherein equivalent inductance of the adjustable inductor is adjusted, such that input impedance looking in the direction away from the resonance unit from the power supply input terminal is featured by negative capacitance.

6 Claims, 6 Drawing Sheets

VOLTAGE CONTROLLED OSCILLATOR

FIELD OF THE INVENTION

The present invention is related to a voltage controlled oscillator, particularly to a voltage controlled oscillator with higher oscillation frequency and adjustable frequency range

BACKGROUND OF THE INVENTION

Generally speaking, a voltage controlled oscillator (abbreviated VCO) is a voltage controlled element, mainly for adjusting outputted oscillation frequency by controlling the input voltage. For enhancing overall performance, further improvement on the circuit of the voltage controlled oscillator is carried out by many manufacturers.

A voltage controlled oscillator, proposed in Taiwan utility model patent no. M407549, for example, includes a resonance unit, a coupling unit, an output unit and an adjustment unit. The resonance unit is provided with a first terminal, a second terminal, a third terminal receiving a bias voltage, and a fourth terminal receiving a first control voltage, as well as generating a first signal at resonance frequency and a second signal at resonance frequency, respectively, in accordance with the bias voltage and the first control voltage. The coupling unit comprises a first transistor and a second transistor. The first transistor is provided with a first terminal electrically connected to the first terminal of the resonance unit, a second terminal, a third terminal, and a control terminal electrically connected to the second terminal of the resonance unit, the third terminal receiving a voltage signal sufficient for reducing the critical voltage of the first transistor. The second transistor is provided with a first terminal electrically connected to the second terminal of the resonance unit and the control terminal of the first transistor, respectively, a second terminal, a third terminal receiving a voltage signal with non-zero magnitude of voltage, and a control terminal electrically connected to the first terminal of the resonance unit and the first terminal of the first transistor, respectively. The output unit is provided with a first terminal electrically connected to the first terminal of the resonance unit, a second terminal electrically connected to the second terminal of the resonance unit, a third terminal, and a fourth terminal, as well as the output unit is allowed for receiving the signal at resonance frequency whereby an output resonance signal is outputted via the third terminal and the fourth terminal thereof. The adjustment unit comprises a fifth capacitor and a sixth capacitor, the fifth capacitor being electrically connected at two terminals thereof to the first terminal and the second terminal of the first transistor, respectively, the sixth capacitor being electrically connected at two terminals thereof to the first terminal and the second terminal of the second transistor, respectively.

In the above prior art, the adjustment unit is composed of the third capacitor, the fourth capacitor, the fifth capacitor, the sixth capacitor, the third inductor and the fourth inductor. Input impedance looking in the direction away from the resonance unit from the first terminal of the second transistor is not featured by negative capacitance, such that the voltage controlled oscillator is only applicable to the operation in low-frequency band with limited adjustable frequency range.

SUMMARY OF THE INVENTION

It is the main object of the present invention to solve the problem of only applicability to the operation in low-frequency band with excessively narrow adjustable frequency range in the conventional voltage controlled oscillator.

For achieving the above object, the present invention provides a voltage controlled oscillator including a resonance unit, a coupling unit and a source degeneration unit. The resonance unit includes two first inductors and two first variable capacitors. Each first inductor is electrically connected at one terminal thereof to a first voltage source, while is electrically connected at the other terminal thereof to one terminal of each first variable capacitor so as to form a first electrical connection point outputting a first oscillation frequency and a second electrical connection point outputting a second oscillation frequency, respectively. The other terminal of each first variable capacitor is electrically connected to a first control voltage. The coupling unit includes a first transistor, a second transistor, a second inductor and a third inductor. A power supply input terminal of the first transistor and that of the second transistor, as well as one terminal of the second inductor and that of the third inductor are electrically connected to the first electrical connection point and the second electrical connection point, respectively. A gate terminal of the first transistor is electrically connected to the other terminal of the third inductor. A gate terminal of the second transistor is electrically connected to the other terminal of the second inductor. The source degeneration unit includes two adjustable inductors, two fourth inductors and two second variable capacitors. Each adjustable inductor is electrically connected at one terminal thereof to a power supply output terminal of the first transistor and that of the second transistor, respectively. One terminal of each fourth inductor is electrically connected to one another to form a third electrical connection point. Each second variable capacitor is electrically connected at one terminal thereof to the other terminal of the adjustable inductor and that of the fourth inductor, respectively, while each second variable capacitor is electrically connected at the other terminal thereof to a second control voltage, respectively. In this case, equivalent inductance of the adjustable inductor is adjusted, such that input impedance looking in the direction away from the resonance unit from the power supply input terminal is featured by negative capacitance.

It is known from the above that, in comparison with prior art, the effect achieved by the present invention is the operation of the voltage controlled oscillator in high-frequency band and widen the adjustable frequency range due to input impedance featuring negative capacitance looking in the direction away from the resonance unit from the power supply input terminal by providing the adjustable inductor and adjusting equivalent inductance in the present invention.

DETAILED DESCRIPTION OF THE PREFERRED EMBODIMENTS

The detailed description and technical content of the present invention will now be described in conjunction with drawings as follows.

Figure 1:
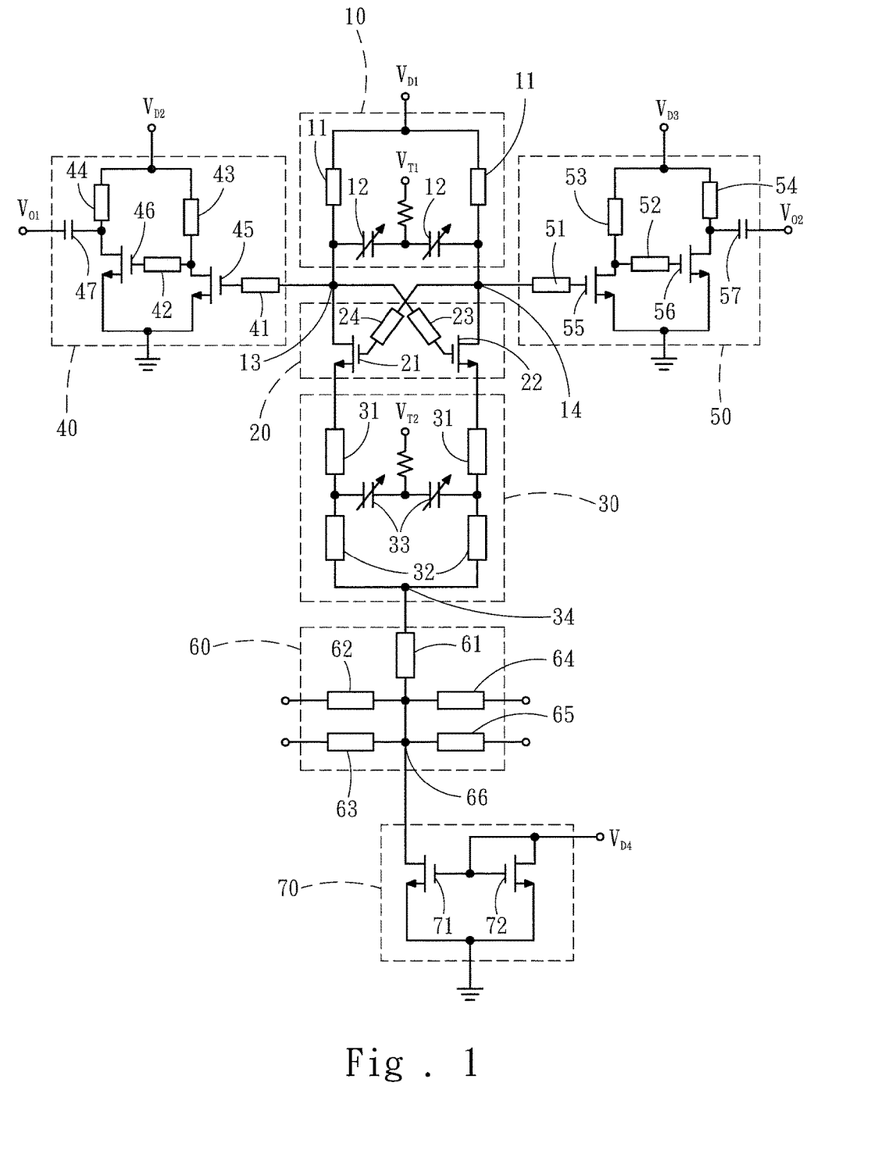
FIG. 1 is a circuit diagram of the voltage controlled oscillator according to one embodiment of the present invention.

Referring to FIG. 1 together, there is shown a circuit diagram of a voltage controlled oscillator according to one embodiment of the present invention. A voltage controlled oscillator of the present invention includes a resonance unit 10, a coupling unit 20 and a source degeneration unit 30. The resonance unit 10 includes two first inductors 11 and two first variable capacitors 12. Each first inductor 11 is electrically connected at one terminal thereof to a first voltage source $V_{D1}$, while is electrically connected at the other terminal thereof to one terminal of each first variable capacitor 12 so as to form a first electrical connection point 13 outputting a first oscillation frequency and a second electrical connection point 14 outputting a second oscillation frequency, respectively. The other terminal of each first variable capacitor 12 is electrically connected to a first control voltage $V_{T1}$, respectively, in which the first control voltage $V_{T1}$ is used for adjusting capacitance of each first variable capacitor 12, so as to further control the first oscillation frequency and the second oscillation frequency of the first electrical connection point 13 and the second electrical connection point 14, respectively.

The coupling unit 20 includes a first transistor 21, a second transistor 22, a second inductor 23 and a third inductor 24. A power supply input terminal of the first transistor 21 and one terminal of the second inductor 23 are electrically connected to the first electrical connection point 13, respectively. A power supply input terminal of the second transistor 22 and one terminal of the third inductor 24 are electrically connected to the second electrical connection point 14. A gate terminal of the first transistor 21 is electrically connected to the other terminal of the third inductor 24. A gate terminal of the second transistor 22 is electrically connected to the other terminal of the second inductor 23. In this embodiment, the length of the second inductor 23 and that of the third inductor 24 may be adjusted to be identical to each other so as to be inductive. Thereby, electrical gain provided by the first transistor 21 and the second transistor 22 may be increased, such that overall equivalent closed-loop gain of the voltage controlled oscillator may be increased to facilitate the generation of oscillation of the voltage controlled oscillator.

The source degeneration unit 30 includes two adjustable inductors 31, two fourth inductors 32 and two second variable capacitors 33. Each adjustable inductor 31 is electrically connected at one terminal thereof to a power supply output terminal of the first transistor 21 and that of the second transistor 22, respectively. One terminal of each fourth inductor 32 is electrically connected to one another to form a third electrical connection point 34. Each second variable capacitor 33 is electrically connected at one terminal thereof to the other terminal of the adjustable inductor 31 and that of the fourth inductor 32, respectively, while each second variable capacitor 33 is electrically connected at the other terminal thereof to a second control voltage $V_{T2}$, respectively. In this case, the second control voltage $V_{T2}$ is used for adjusting capacitance of the second variable capacitors 33, and further, controlling output frequency components of the output electrical signal of the voltage controlled oscillator, i.e., a first oscillation frequency output terminal $V_{O1}$ at left side of a first capacitor 47 and a second oscillation frequency output terminal $V_{O2}$ at right side of a second capacitor 57. In this embodiment, the oscillation frequency provided by the resonance unit 10, the coupling unit 20 and the source degeneration unit 30 cooperatively may be risen above 90 GHz due to input impedance Rin featuring negative capacitance, looking in the direction away from the resonance unit 10 from the power supply input terminal of the second transistor 22, obtained by adjusting equivalent inductance of the adjustable inductor 31. Moreover, the range of the oscillation frequency is adjusted between 91 GHz and 97 GHz by controlling the magnitude of the first control voltage $V_{T1}$ and that of the second control voltage $V_{T2}$.

In the present invention, the voltage controlled oscillator further includes a first output buffer unit 40, a second output buffer unit 50, a second-harmonic generating unit 60 and a current mirror unit 70. The first output buffer unit 40 includes a fifth inductor 41, a sixth inductor 42, a seventh inductor 43, an eighth inductor 44, a third transistor 45, a fourth transistor 46 and a first capacitor 47. The fifth inductor 41 is electrically connected at one terminal thereof to the first electrical connection point 13, while is electrically connected at the other terminal thereof to a gate terminal of the third transistor 45. The third transistor 45 is electrically connected at a power supply input terminal thereof to one terminal of the sixth inductor 42 and that of the seventh inductor 43, while is electrically connected at a power supply output terminal thereof to a ground terminal. The sixth inductor 42 is electrically connected at the other terminal thereof to a gate terminal of the fourth transistor 46, and the seventh inductor 43 is electrically connected at the other terminal thereof to a second voltage source $V_{D2}$, respectively. The fourth transistor 46 is electrically connected at a power supply input terminal thereof to one terminal of the eighth inductor 44 and that of the first capacitor 47, while is electrically connected at a power supply output terminal thereof to the ground terminal. The eighth inductor 44 is electrically connected at the other terminal thereof to the second voltage source $V_{D2}$, and the first capacitor 47 is electrically connected at the other terminal thereof to a first oscillation frequency output terminal $V_{O1}$, respectively.

The second output buffer unit 50 includes a ninth inductor 51, a tenth inductor 52, an eleventh inductor 53, a twelfth inductor 54, a fifth transistor 55, a sixth transistor 56 and a second capacitor 57. The ninth inductor 51 is electrically connected at one terminal thereof to the second electrical connection point 14, while is electrically connected at the other terminal thereof to a gate terminal of the fifth transistor 55. The fifth transistor 55 is electrically connected at a power supply input terminal thereof to one terminal of the tenth inductor 52 and that of the eleventh inductor 53, while is electrically connected at a power supply output terminal thereof to a ground terminal. The tenth inductor 52 is electrically connected at the other terminal thereof to a gate terminal of the sixth transistor 56, and the eleventh inductor 53 is electrically connected at the other terminal thereof to a third voltage source $V_{D3}$, respectively. The sixth transistor 56 is electrically connected at a power supply input terminal thereof to one terminal of the twelfth inductor 54 and that of the second capacitor 57, while is electrically connected at a power supply output terminal thereof to the ground terminal. The twelfth inductor 54 is electrically connected at the other terminal thereof to the third voltage source $V_{D3}$, and the second capacitor 57 is electrically connected at the other terminal thereof to a second oscillation frequency output terminal $V_{O2}$, respectively. In this embodiment, the purpose of providing the fifth inductor 41, the sixth inductor 42, the ninth inductor 51 and the tenth inductor 52 is to eliminate parasitic capacitance of the third transistor 45, the fourth transistor 46, the fifth transistor 55 and the sixth transistor 56 by series gain peaking technology, whereby output power of the voltage controlled oscillator is increased and phase noise is mitigated. The parasitic capacitance of the third transistor 45 is parasitic capacitance caused by physical connection between the gate terminal of the third transistor 45 and the first electrical connection point 13 in the right circuit. The parasitic capacitance of the fourth transistor 46 is parasitic capacitance caused by physical connection between the gate terminal of the first capacitor 47 and the electrical connection point in the right circuit, i.e., the right terminal of the sixth inductor 42. The parasitic capacitance of the fifth transistor 55 is parasitic capacitance caused by physical connection between the gate terminal of the fifth transistor 55 and the second electrical connection point 14 in the left circuit. The parasitic capacitance of the sixth transistor 56 is parasitic capacitance caused by physical connection between the gate terminal of the second capacitor 57 and the electrical connection point in the left circuit, i.e., the left terminal of the tenth inductor 52.

The second-harmonic generating unit 60 includes a first transmission line 61, a second transmission line 62, a third transmission line 63, a fourth transmission line 64 and a fifth transmission line 65. The first transmission line 61 is electrically connected at one terminal thereof to the third electrical connection point 34. One terminal of the second transmission line 62, one terminal of the third transmission line 63, one terminal of the fourth transmission line 64 and one terminal of the fifth transmission line 65 are electrically connected to the other terminal of the first transmission line 61, respectively, so as to form a fourth electrical connection point 66. In this embodiment, the length of the first transmission line 61 is equivalent to one-fourth of wavelength of the second harmonic at the oscillation frequency, the length of the second transmission line 62 is equivalent to one-fourth of wavelength of the fundamental frequency at the oscillation frequency, the length of the third transmission line 63 is equivalent to one-fourth of wavelength of the second harmonic at the oscillation frequency, the length of the fourth transmission line 64 is equivalent to one-fourth of wavelength of the third harmonic at the oscillation frequency, and the length of the fifth transmission line 65 is equivalent to one-fourth of wavelength of the fourth harmonic at the oscillation frequency. In this case, the second-harmonic generating unit 60 is provided in the manner of opening at terminals on both left and right sides, and the circuit looking in the direction away from the source degeneration unit 30 from the first transmission line 61 is considered as a short circuit for the fundamental frequency, the second harmonic, the third harmonic and the fourth harmonic of the oscillation frequency, such that the second harmonic of an oscillation frequency is generated at the power supply output terminals of the first transistor 21 and the second transistor 22.

The above-mentioned "oscillation frequency" is an oscillation frequency measured at the first electrical connection point 13 and the second electrical connection point 14. More specifically, although the first electrical connection point 13 and the second electrical connection point 14 belong to the circuit on a chip, and then inaccessible to be measured, it is practical to calculate the oscillation frequency of the first electrical connection point 13 and that of the second electrical connection point 14 by measuring the oscillation frequency of the first oscillation frequency output terminal $V_{O1}$ and that of the second oscillation frequency output terminal $V_{O2}$, because the oscillation frequency of the first electrical connection point 13 and that of the second electrical connection point 14 may be approximate to the oscillation frequency of the first oscillation frequency output terminal $V_{O1}$ and that of the second oscillation frequency output terminal $V_{O2}$.

The current mirror unit 70 includes a seventh transistor 71 and an eighth transistor 72. The seventh transistor 71 is electrically connected at a power supply input terminal thereof to the fourth electrical connection point 66. The eighth transistor 72 is electrically connected at a power supply input terminal thereof to a gate terminal of the seventh transistor 71 and that of the eighth transistor 72, respectively. Each of the seventh transistor 71 and the eighth transistor 72 is electrically connected at a power supply output terminal thereof to a ground terminal, respectively. In this embodiment, the eighth transistor 72 is electrically connected at the power supply input terminal thereof to a fourth voltage source $V_{D4}$. When the voltage is supplied to the current mirror unit 70 from the fourth voltage source $V_{D4}$, a stable bias current, facilitating the stabilization of the current characteristic of the first transistor 21 and the second transistor 22, is formed by the seventh transistor 71.

In the present invention, the type of the transistors may be a Bipolar Junction transistor (abbreviated BJT), a Field Effect transistor (abbreviated FET), a Junction Field Effect transistor (abbreviated JFET), a Metal Oxide Semiconductor Field Effect transistor (abbreviated MOSFET), or the combination thereof.

Figure 2A:
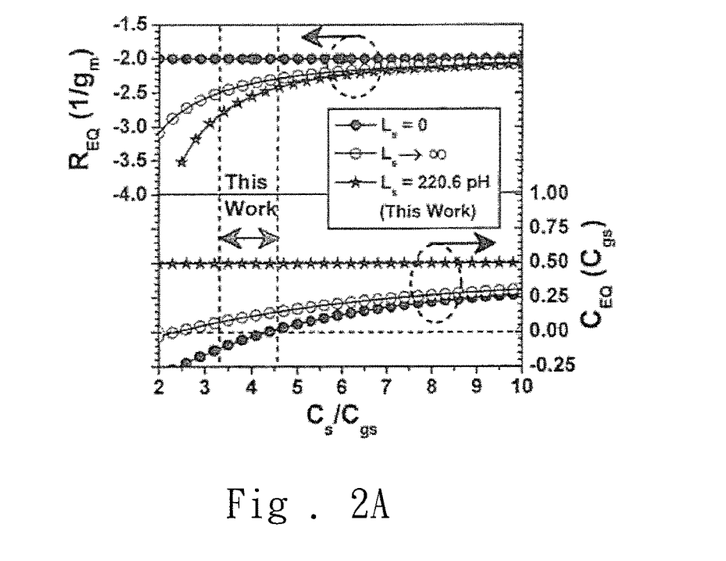
FIG. 2A is a waveform diagram of oscillation frequency with the adjustable inductor being provided according to one embodiment of the present invention.
Figure 2B:
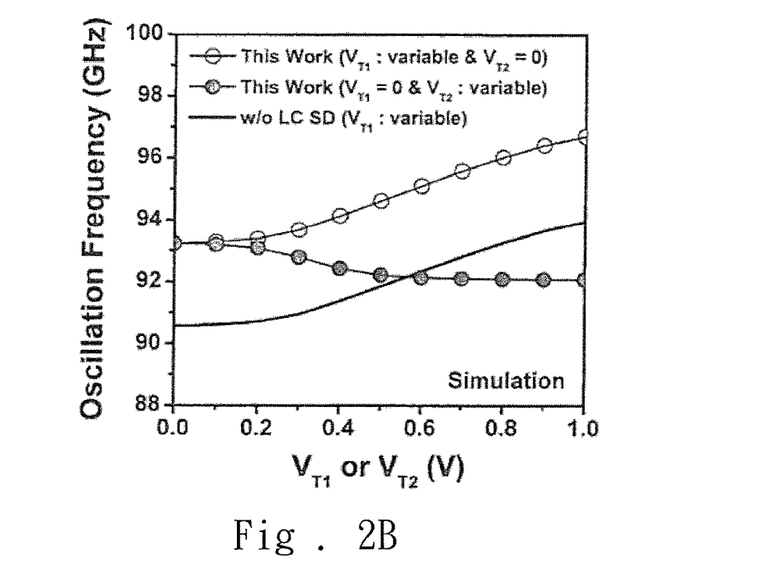
FIG. 2B is a waveform diagram of oscillation frequency with the adjustable inductor being provided according to one embodiment of the present invention.
Figure 2C:
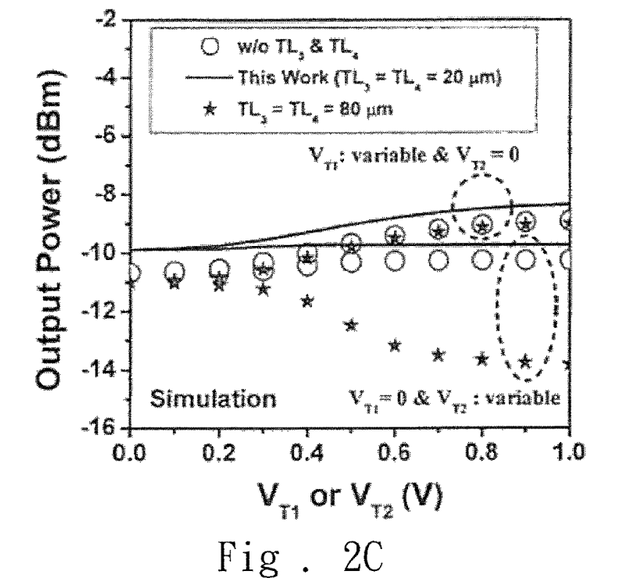
FIG. 2C is a waveform diagram for comparison of output power with the adjustable inductor being provided according to one embodiment of the present invention.
Figure 2D:
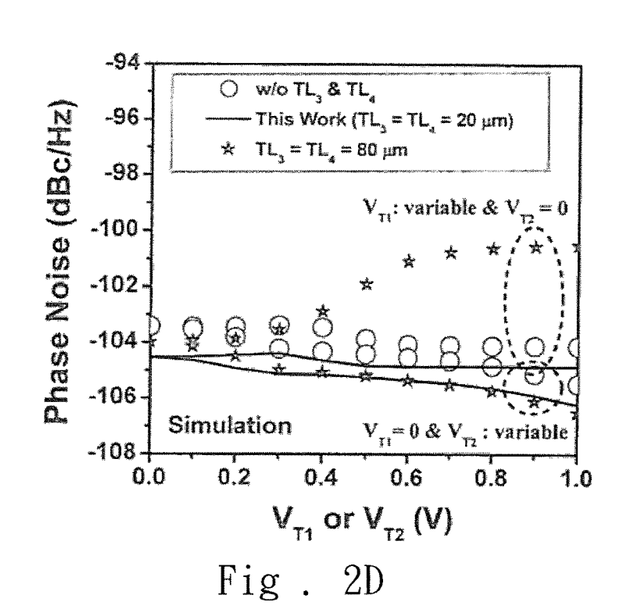
FIG. 2D is a waveform diagram for comparison of phase noise with the adjustable inductor being provided according to one embodiment of the present invention.

In the actual measurement, referring to FIGS. 2A-D, the oscillation frequency measured by the measuring instrument is higher than 90 GHz, and the range of the oscillation frequency is adjusted between 91 GHz and 97 GHz through the adjustment of the magnitude of the first control voltage $V_{T1}$ and the second control voltage $V_{T2}$, on condition that the adjustable inductor 31 is provided (experimental group "This Work" in FIG. 2B). In FIG. 2A, the abscissa ($C_s/C_{gs}$) indicates the ratio of parasitic capacitance between the first transistor 21 and the second transistor 22, while the ordinate ($R_{EQ}$) indicates variance of negative resistance inside the voltage controlled oscillator of this disclosure. It can be seen that the magnitude of equivalent resistance is a negative number ranging from −2.5 to −3.0 on condition that the adjustable inductor 31 of the voltage controlled oscillator of this disclosure (referring to $L_s$ in FIG. 2A) is operated at 220.6 pH, so as to enable the voltage controlled oscillator of this disclosure to oscillate. The output power measured by the measuring instrument with the adjustable inductor 31 being provided (i.e., group "This Work") is relatively higher than that without the adjustable inductor 31 being provided (i.e., group "w/o $TL_3$&$TL_4$"), as illustrated in FIG. 2C. The phase noise measured by the measuring instrument with the adjustable inductor 31 being provided (i.e., group "This Wok") is relatively lower than that without the adjustable inductor 31 being provided (i.e., group "w/o $TL_3$&$TL_4$"), as illustrated in FIG. 2D. In this embodiment, the adjustable inductor 31 with different length is also used for comparison (i.e., experimental group "$TL_3$=$TL_4$=80 μm"). It is known from the test that the length of the adjustable inductor 31 ranging from 15 μm to 25 μm is preferred.

Figure 3A:
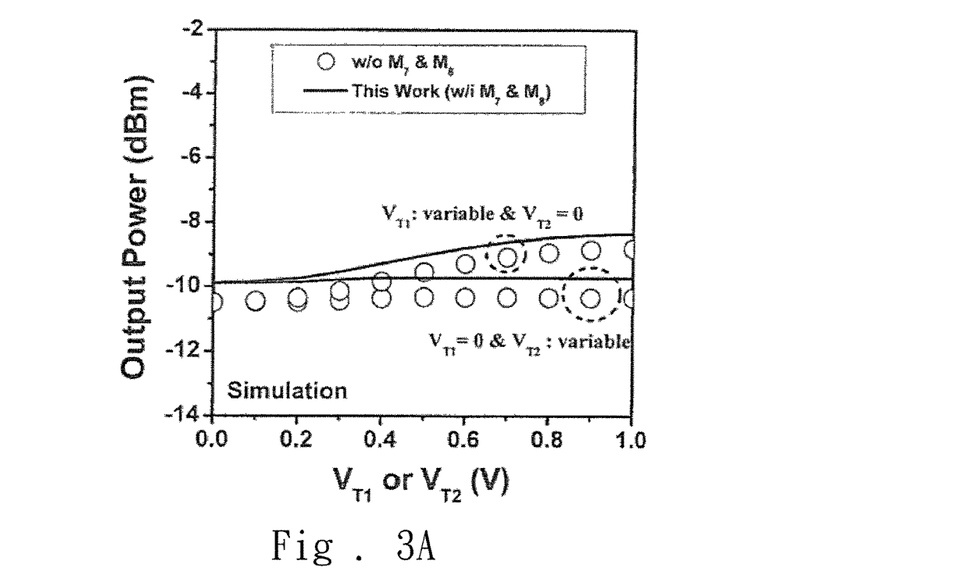
FIG. 3A is a waveform diagram for comparison of output power with the current mirror unit being provided according to one embodiment of the present invention.
Figure 3B:
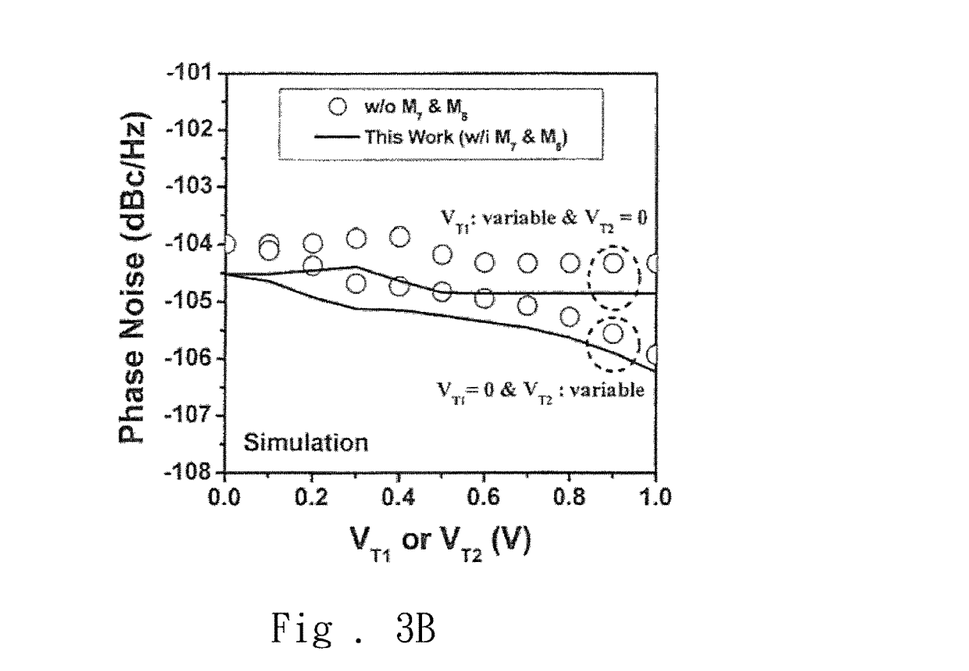
FIG. 3B is a waveform diagram for comparison of phase noise with the current mirror unit being provided according to one embodiment of the present invention.

Referring to FIGS. 3A-B, the output power measured by the measuring instrument with the current mirror unit 70 being provided (i.e., group "This Work (w/i $M_7$&$M_8$)") is relatively higher than that without the current mirror unit 70 being provided (i.e., group "w/o $M_7$&$M_8$"), as illustrated in FIG. 3A. The phase noise measured by the measuring instrument with the current mirror unit 70 being provided (i.e., group "This Work (w/i $M_7$&$M_8$)") is relatively lower than that without the current mirror unit 70 being provided (i.e., group "w/o $M_7$&$M_8$"), as illustrated in FIG. 3B.

Figure 4A:
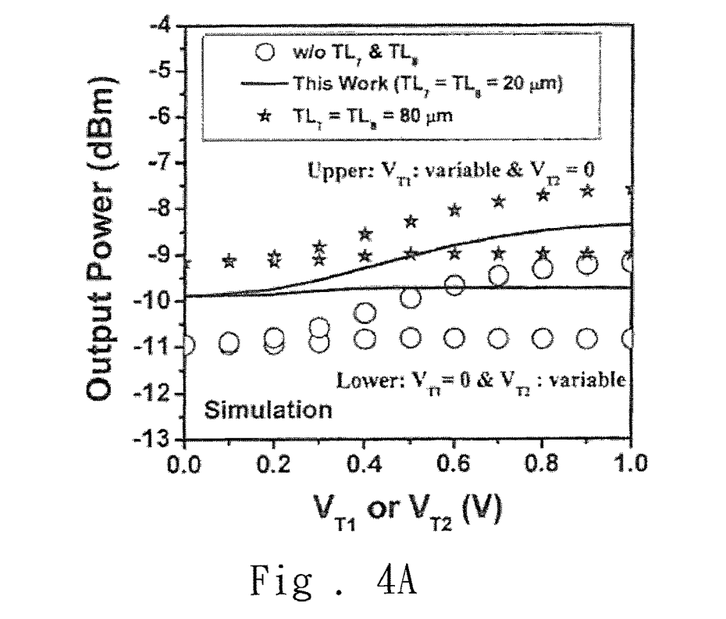
FIG. 4A is a waveform diagram for comparison of output power with the fifth inductor and the ninth inductor being provided according to one embodiment of the present invention.
Figure 4B:
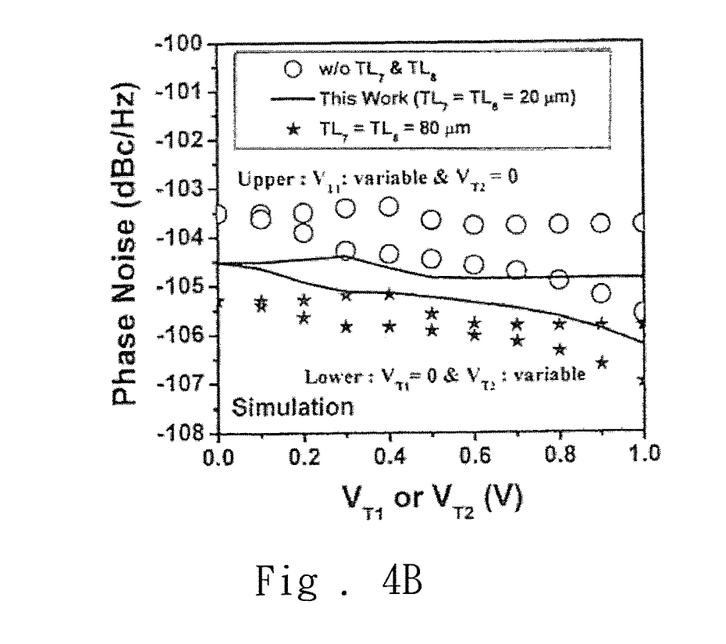
FIG. 4B is a waveform diagram for comparison of phase noise with the fifth inductor and the ninth inductor being provided according to one embodiment of the present invention.
Figure 4C:
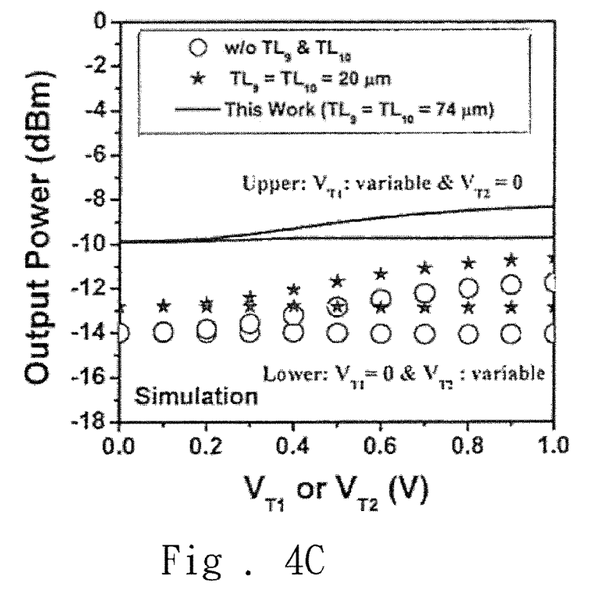
FIG. 4C is a waveform diagram for comparison of output power with the sixth inductor and the tenth inductor being provided according to one embodiment of the present invention.
Figure 4D:
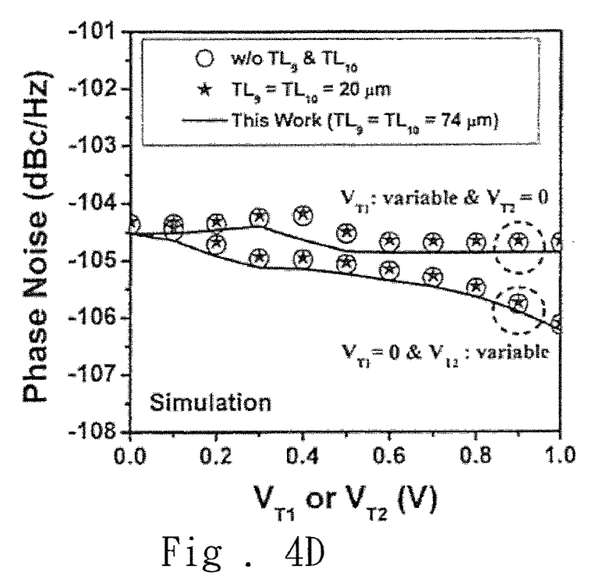
FIG. 4D is a waveform diagram for comparison of phase noise with the sixth inductor and the tenth inductor being provided according to one embodiment of the present invention.

Referring to FIGS. 4A-D, the output power measured by the measuring instrument with the fifth inductor 41 (i.e., "$TL_8$"), the sixth inductor 42 (i.e., "$TL_{10}$"), the ninth inductor 51 (i.e., "$TL_7$"), and the tenth inductor 52 (i.e., "$TL_9$") being provided is relatively higher than that without the fifth inductor 41, the sixth inductor 42, the ninth inductor 51 and the tenth inductor 52 being provided, as illustrated in FIGS. 4A and 4C. The phase noise measured by the measuring instrument with the fifth inductor 41, the sixth inductor 42, the ninth inductor 51 and the tenth inductor 52 being provided (i.e., group "This Work ($TL_7$=$TL_8$=20 μm)" in FIGS. 4A and 4B, and group "This Work ($TL_9$=$TL_{10}$=74 μm)" in FIGS. 4C and 4D) is relatively lower than that without the fifth inductor 41, the sixth inductor 42, the ninth inductor 51 and the tenth inductor 52 (i.e., group "w/o $TL_7$&$TL_8$" in FIGS. 4A and 4B, and group "w/o $TL_9$&$TL_{10}$" in FIGS. 4C and 4D), as illustrated in FIGS. 4B and 4D. In this embodiment, the fifth inductor 41, the sixth inductor 42, the ninth inductor 51 and the tenth inductor 52 with different lengths are also used for comparison (i.e., group "$TL_7$=$TL_8$=80 μm" in FIG. 4A and 4B, and group "$TL_9$=$TL_{10}$=20 μm" in FIGS. 4C and 4D). It is known from the test that each of the length of the fifth inductor 41 and that of the ninth inductor 51 ranging from 15 μm to 25 μm is preferred, as well as each of the length of the sixth inductor 42 and that of the tenth inductor 52 ranging from 70 μm to 80 μm is preferred.

To sum up, the source degeneration unit of the present invention is provided with the adjustable inductor, and equivalent inductance of the adjustable inductor is adjusted, such that input impedance looking in the direction away from the resonance unit from the power supply input terminal is featured by negative capacitance. Thus, the voltage controlled oscillator is operated in high-frequency band, adjustable frequency range is widened, output power is increased, and phase noise is reduced. In the present invention, moreover, the current mirror unit is provided as well as the fifth inductor, the sixth inductor, the ninth inductor and the tenth inductor are provided in the first output buffer unit and the second output buffer unit, respectively, so as to also increase the output power of the voltage controlled oscillator and reduce the phase noise.

What is claimed is:

1. A voltage controlled oscillator, comprising:
   a resonance unit, including two first inductors and two first variable capacitors, each first inductor being electrically connected at one terminal thereof to a first voltage source, while being electrically connected at the other terminal thereof to one terminal of each first variable capacitor so as to form a first electrical connection point outputting a first oscillation frequency and a second electrical connection point outputting a second oscillation frequency, respectively, the other terminal of each first variable capacitor being electrically connected to a first control voltage;
   a coupling unit, including a first transistor, a second transistor, a second inductor and a third inductor, a power supply input terminal of said first transistor and that of said second transistor, as well as one terminal of said second inductor and that of said third inductor being electrically connected to said first electrical connection point and said second electrical connection point, respectively, a gate terminal of said first transistor being electrically connected to the other terminal of said third inductor, a gate terminal of said second transistor being electrically connected to the other terminal of said second inductor; and
   a source degeneration unit, including two adjustable inductors, two fourth inductors and two second variable capacitors, each adjustable inductor being electrically connected at one terminal thereof to a power supply output terminal of said first transistor and that of said second transistor, respectively, one terminal of each fourth inductor being electrically connected to one another to form a third electrical connection point, each second variable capacitor being electrically connected at one terminal thereof to the other terminal of said adjustable inductor and that of said fourth inductor, respectively, while each second variable capacitor being electrically connected at the other terminal thereof to a second control voltage, respectively;
   wherein equivalent inductance of said adjustable inductor is adjusted, such that input impedance looking in the direction away from said resonance unit from the power supply input terminal is featured by negative capacitance.

2. The voltage controlled oscillator according to claim 1, further comprising a first output buffer unit including a fifth inductor, a sixth inductor, a seventh inductor, an eighth inductor, a third transistor, a fourth transistor and a first capacitor, said fifth inductor being electrically connected at one terminal thereof to said first electrical connection point, while being electrically connected at the other terminal thereof to a gate terminal of said third transistor, said third transistor being electrically connected at a power supply input terminal thereof to one terminal of said sixth inductor and that of said seventh inductor, while being electrically connected at a power supply output terminal thereof to a ground terminal, said sixth inductor being electrically connected at the other terminal thereof to a gate terminal of said fourth transistor, and said seventh inductor being electrically connected at the other terminal thereof to a second voltage source, respectively, said fourth transistor being electrically connected at a power supply input terminal thereof to one terminal of said eighth inductor and that of said first capacitor, while being electrically connected at a power supply output terminal thereof to said ground terminal, said eighth inductor being electrically connected at the other terminal thereof to said second voltage source, and said first capacitor being electrically connected at the other terminal thereof to a first oscillation frequency output terminal, respectively.

3. The voltage controlled oscillator according to claim 1, further comprising a second output buffer unit including a ninth inductor, a tenth inductor, an eleventh inductor, a twelfth inductor, a fifth transistor, a sixth transistor and a second capacitor, said ninth inductor being electrically connected at one terminal thereof to said second electrical connection point, while being electrically connected at the other terminal thereof to a gate terminal of said fifth transistor, said fifth transistor being electrically connected at a power supply input terminal thereof to one terminal of said tenth inductor and that of said eleventh inductor, while being electrically connected at a power supply output terminal thereof to a ground terminal, said tenth inductor being electrically connected at the other terminal thereof to a gate terminal of said sixth transistor, and said eleventh inductor being electrically connected at the other terminal thereof to a third voltage source, respectively, said sixth transistor being electrically connected at a power supply input terminal thereof to one terminal of said twelfth inductor and that of said second capacitor, while being electrically connected at a power supply output terminal thereof to said ground terminal, said twelfth inductor being electrically connected at the other terminal thereof to said third voltage source and said second capacitor being electrically connected at the other terminal thereof to a second oscillation frequency output terminal, respectively.

4. The voltage controlled oscillator according to claim 1, further comprising a second-harmonic generating unit including a first transmission line, a second transmission line, a third transmission line, a fourth transmission line and a fifth transmission line, said first transmission line being electrically connected at one terminal thereof to said third electrical connection point, while one terminal of said second transmission line, one terminal of said third transmission line, one terminal of said fourth transmission line and one terminal of said fifth transmission line being electrically connected to the other terminal of said first transmission line, respectively, so as to form a fourth electrical connection point.

5. The voltage controlled oscillator according to claim 4, wherein the length of said first transmission line is equivalent to one-fourth of wavelength of the second harmonic at the oscillation frequency, the length of said second transmission line is equivalent to one-fourth of wavelength of the fundamental frequency at the oscillation frequency, the length of said third transmission line is equivalent to one-fourth of wavelength of the second harmonic at the oscillation frequency, the length of said fourth transmission line is equivalent to one-fourth of wavelength of the third harmonic at the oscillation frequency, and the length of said fifth transmission line is equivalent to one-fourth of wavelength of the fourth harmonic at the oscillation frequency.

6. The voltage controlled oscillator according to claim 4, further comprising a current mirror unit including a seventh transistor and an eighth transistor, said seventh transistor being electrically connected at a power supply input terminal thereof to said fourth electrical connection point, said eighth transistor being electrically connected at a power supply input terminal thereof to a gate terminal of said seventh transistor and that of said eighth transistor, respectively, each of said seventh transistor and said eighth transistor being electrically connected at a power supply output terminal thereof to a ground terminal, respectively.

* * * * *